(12) United States Patent
Zeng

(10) Patent No.: US 11,765,857 B2
(45) Date of Patent: Sep. 19, 2023

(54) FAN AND ELECTRONIC DEVICE HAVING THE SAME

(71) Applicant: CHAMP TECH OPTICAL (FOSHAN) CORPORATION, Foshan (CN)

(72) Inventor: Ling-Jun Zeng, Foshan (CN)

(73) Assignee: CHAMP TECH OPTICAL (FOSHAN) CORPORATION, Foshan (CN)

(*) Notice: Subject to any disclaimer, the term of this patent is extended or adjusted under 35 U.S.C. 154(b) by 0 days.

(21) Appl. No.: 17/824,013

(22) Filed: May 25, 2022

(65) Prior Publication Data

US 2023/0022697 A1 Jan. 26, 2023

(30) Foreign Application Priority Data

Jul. 20, 2021 (CN) .......................... 202121649195.4

(51) Int. Cl.
*H05K 7/20* (2006.01)
*F04D 29/60* (2006.01)
*F04D 29/52* (2006.01)
*F04D 29/32* (2006.01)

(52) U.S. Cl.
CPC ....... *H05K 7/20172* (2013.01); *F04D 29/326* (2013.01); *F04D 29/522* (2013.01); *F04D 29/601* (2013.01); *H05K 7/20145* (2013.01)

(58) Field of Classification Search
CPC .. F04D 25/0613; F04D 29/326; F04D 29/522; F04D 29/584; F04D 29/601; H05K 7/20172; H05K 7/20145
See application file for complete search history.

(56) References Cited

U.S. PATENT DOCUMENTS

| 1,724,604 A * | 8/1929 | Lambert | F04D 29/326 |
| | | | 29/889.3 |
| 3,189,982 A * | 6/1965 | Merz | F04D 29/326 |
| | | | 29/889.3 |
| 5,407,324 A * | 4/1995 | Starnes, Jr. | F04D 25/0613 |
| | | | 415/214.1 |

(Continued)

FOREIGN PATENT DOCUMENTS

WO WO-2007085123 A1 * 8/2007 ........... F04D 29/326

OTHER PUBLICATIONS

WO-2007085123 (Zhao, H., Aug. 2007), English Translation (Year: 2023).*

*Primary Examiner* — Justin D Seabe
*Assistant Examiner* — Aye S Htay
(74) *Attorney, Agent, or Firm* — ScienBiziP, P.C.

(57) ABSTRACT

A fan and an electronic device are provided. The fan includes a hub, an outer frame surrounding the hub, and a plurality of blades connected between the hub and the outer frame. The outer frame includes a first side facing an air inlet of the fan, a second side facing an air outlet of the fan, and an inner wall between the first side and the second side. Each of the plurality of blades includes a first end connected to the hub and a second end connected to the outer frame. The second end includes a first region and a second region, the second region is connected to the inner wall. The first region extends from the second region and is disposed above the first side. A first notch is defined among the first regions of two adjacent blades and the first side.

18 Claims, 4 Drawing Sheets

(56) References Cited

U.S. PATENT DOCUMENTS

| | | | | |
|---|---|---|---|---|
| 6,053,242 | A * | 4/2000 | Hsieh | H01L 23/467 |
| | | | | 257/E23.099 |
| 6,561,762 | B1 * | 5/2003 | Horng | F04D 29/544 |
| | | | | 415/220 |
| 6,572,346 | B2 * | 6/2003 | Hsieh | F04D 29/083 |
| | | | | 310/68 R |
| 6,710,486 | B1 * | 3/2004 | Horng | F04D 29/667 |
| | | | | 310/59 |
| 6,726,455 | B2 * | 4/2004 | Horng | F04D 27/004 |
| | | | | 417/423.15 |
| 6,844,641 | B1 * | 1/2005 | Horng | F04D 29/526 |
| | | | | 310/89 |
| 8,251,674 | B1 * | 8/2012 | Pairaktaridis | F04D 25/0613 |
| | | | | 310/67 R |
| 2004/0047734 | A1 * | 3/2004 | Nilson | F04D 29/326 |
| | | | | 416/189 |
| 2005/0180849 | A1 * | 8/2005 | Chen | F04D 29/326 |
| | | | | 415/220 |
| 2013/0039783 | A1 * | 2/2013 | Wagner | F04D 29/263 |
| | | | | 417/313 |

* cited by examiner

FAN AND ELECTRONIC DEVICE HAVING THE SAME

FIELD

The subject matter herein generally relates to heat dissipation, and more particularly, to a fan and an electronic device having the fan.

BACKGROUND

Electronic devices, such as servers, may have heat sinks and fans for heat dissipation purposes. The heat sink dissipates heat generated by a heat generating component in the server, such as an electronic chip. The fan is disposed on the heat sink to accelerate air circulation around the heat sink. Thus, the electronic chip can operate normally. However, when the fan works, a portion of air at terminal ends of blades may leak. Thus, the air passing through the fan cannot blow to the heat sink under the fan, which reduces the heat dissipation efficiency.

Therefore, there is a room for improvement in the art.

BRIEF DESCRIPTION OF THE DRAWINGS

Implementations of the present technology will now be described, by way of embodiment, with reference to the attached figures.

DETAILED DESCRIPTION

Figure 1:
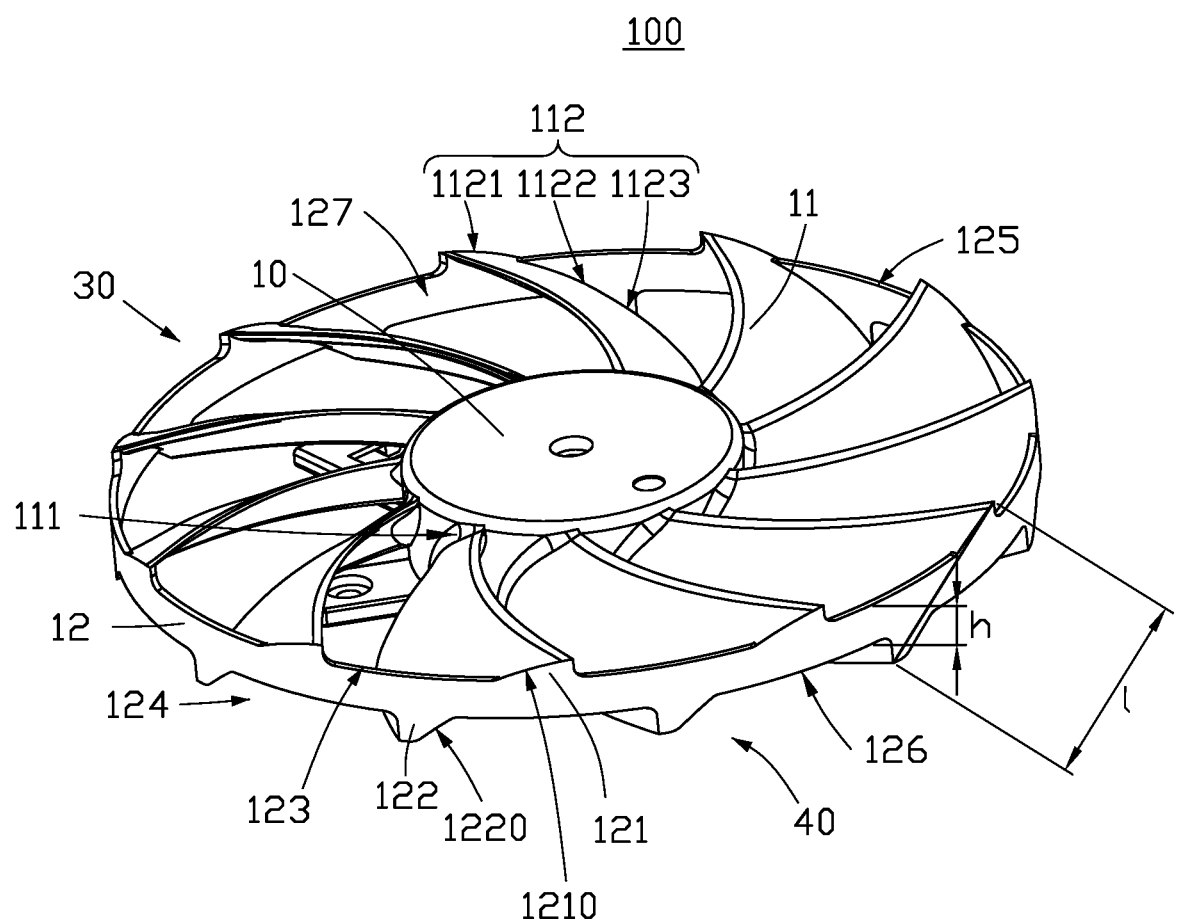
FIG. 1 is a diagrammatic view of a fan according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and members have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
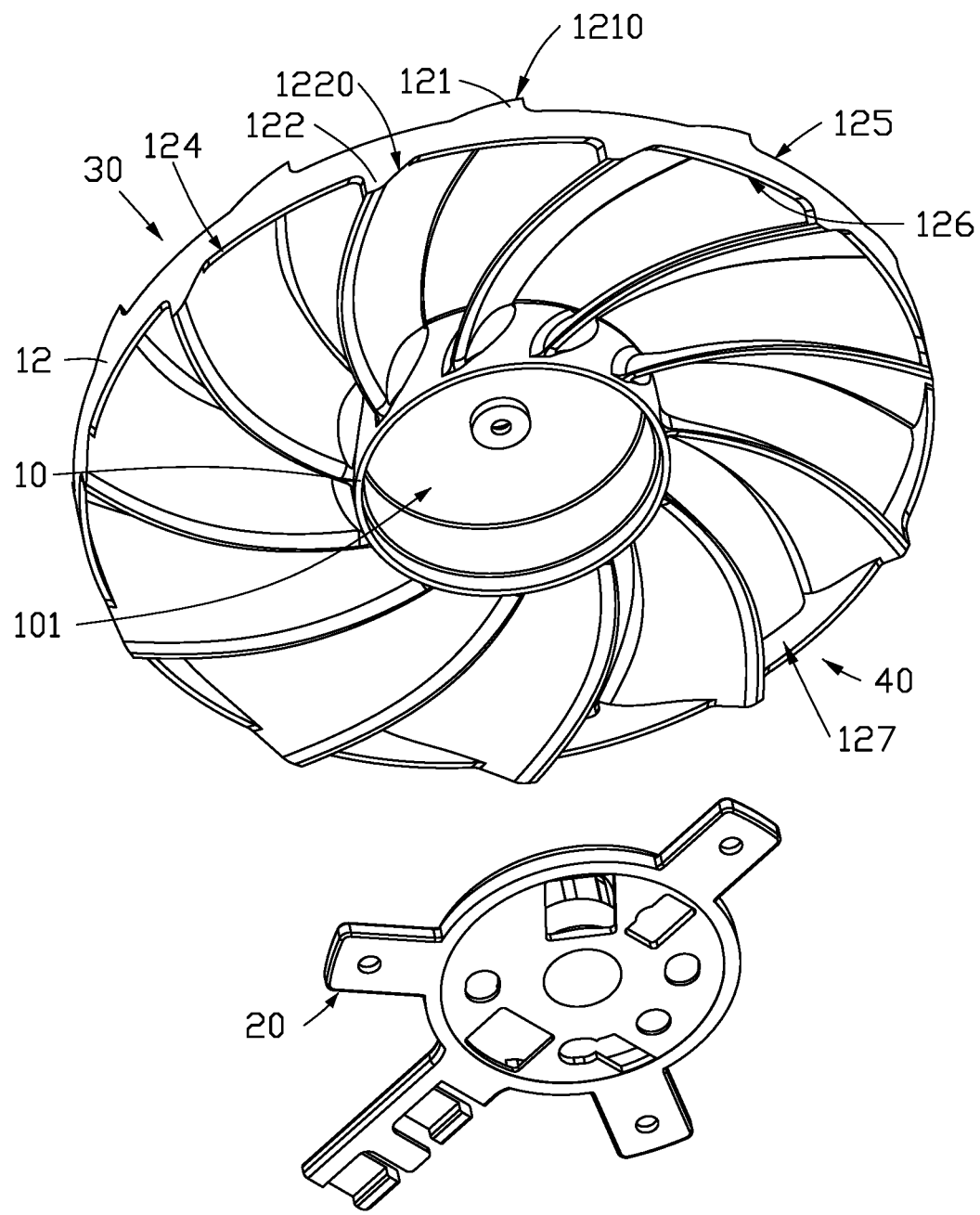
FIG. 2 is an exploded view of the fan of FIG. 1.

Referring to FIGS. 1 and 2, a fan 100 is provided according to an embodiment of the present disclosure. The fan 100 may be installed on a heat sink 201 (see FIG. 4), and is used to accelerate an air flow around the heat sink 201. The fan 100 has an air inlet 30 and an air outlet 40 opposite to the air inlet 30. The air outlet 40 faces the heat sink 201.

The fan 100 includes a hub 10, an outer frame 12 surrounding the hub 10, and a plurality of blades 11 inclinedly connected between the hub 10 and the outer frame 12 (that is, a plane defined by each of the blades 11 is inclined with respect to a plane defined by the hub 10, and is also inclined with respect to a plane defined by the outer frame 12). The hub 10 may be disc-shaped, and the outer frame 12 may be annular. The hub 10 and the outer frame 12 are coaxial with each other. The blades 11 are spaced from each other at equal intervals. Each of the blades 11 has a first end 111 and a second end 112 opposite to the first end 111. The first end 111 is connected to the hub 10, and the second end 112 is connected to the outer frame 12. An extension direction of the second end 112 is inclined with respect to the plane defined by the outer frame 12.

The outer frame 12 has a first side 125, a second side 126 opposite to the first side 125, and an inner wall 127 connecting the first side 125 to the second side 126. The first side 125 faces the air inlet 30, and the second side 126 faces the air outlet 40.

The second end 112 of each of the blades 11 includes a first region 1121, a second region 1122, and a third region 1123. The first region 1121 and the third region 1123 are disposed at two sides of the second region 1122. The second region 1122 is connected to the inner wall 127 of the outer frame 12. The first region 1121 is disposed above the first side 125, and the third region 1123 is disposed above the second side 126. Therefore, when air enters the fan 100 through the air inlet 30, the outer frame 12 prevents the air from blowing away at the second end 112, so that a large portion of such air can blow towards the heat sink 201 below the fan 100. Furthermore, noise generated by the air flow that blows away at the second end 112 and knocks on a shell (not shown) outside the fan 100 is reduced.

In some embodiments, a first notch 123 is defined among the first regions 1121 of two adjacent blades 11 and the first side 125. The first notch 123 reduces a total weight of the fan 100, so as to reduce a resistance that the air applies onto the outer frame 12 when the fan 100 rotates, thereby improve the working efficiency of the fan 100. The first notch 123 also increases the amount of air flow generated by the fan 100.

In some embodiments, the outer frame 12 further includes a plurality of first protrusions 121 protruding from the first side 125. The first region 1121 connects to a top surface 1210 of the first protrusion 121 away from the first side 125. The first notch 123 is disposed between two adjacent first protrusions 121. The first protrusion 121 enhances a connection strength between the blade 11 and the outer frame 12, and also improves a service life of the fan 100.

In some embodiments, a second notch 124 is defined among the third regions 1123 of two adjacent blades 11 and the second side 126. The second notch 124 allows the air flow out of the air outlet 40 to blow the heat sink 201 in a shaped of a trumpet. Thus, the air flow covers the heat sink 201 with an increased surface area.

In some embodiments, the outer frame 12 further includes a plurality of second protrusions 122 protruding from the second side 126. The third region 1123 of each of the blades 11 is connected to a top surface 1220 of the second protrusion 122 away from the second side 126. The second notch 124 is disposed between two adjacent second protrusions 122. The second protrusion 122 also increases the connection strength between the blade 11 and the outer frame 12. When the first protrusions 121 and the second protrusions 122 are projected onto a plane perpendicular to a central axis of the hub 10, orthogonal projections of the first protrusions 121 and orthogonal projections of the second protrusions 122 are staggered with each other. In some embodiments, each of the first protrusion 121 and the second protrusion 122 is triangular. An inclined direction of each of the first protrusion 121 and the second protrusion 122 is the same as an inclined direction of the blades 11.

Referring to FIG. 1, in some embodiments, a minimum height (denoted as "h") of the outer frame 12 is greater than one third of a length (denoted as "l") of the second side 126. That is, the minimum height "h" and the length "l" satisfy the following equation: h>(⅓)l. The minimum height "h" is defined as a height from the first side 125 to the second side 126. The length "l" is defined as a maximum length from the first region 1121 to the third region 1123. If the above equation is not satisfied, the connection strength between the outer frame 12 and the blade 11 is reduced. In some embodiments, the outer frame 12 is disposed in a middle area of the second end 112 of each of the blades 11.

In some embodiments, the hub 10, the blades 11, and the outer frame 12 are integrally formed. The fan 100 can be made of plastic.

Figure 3:
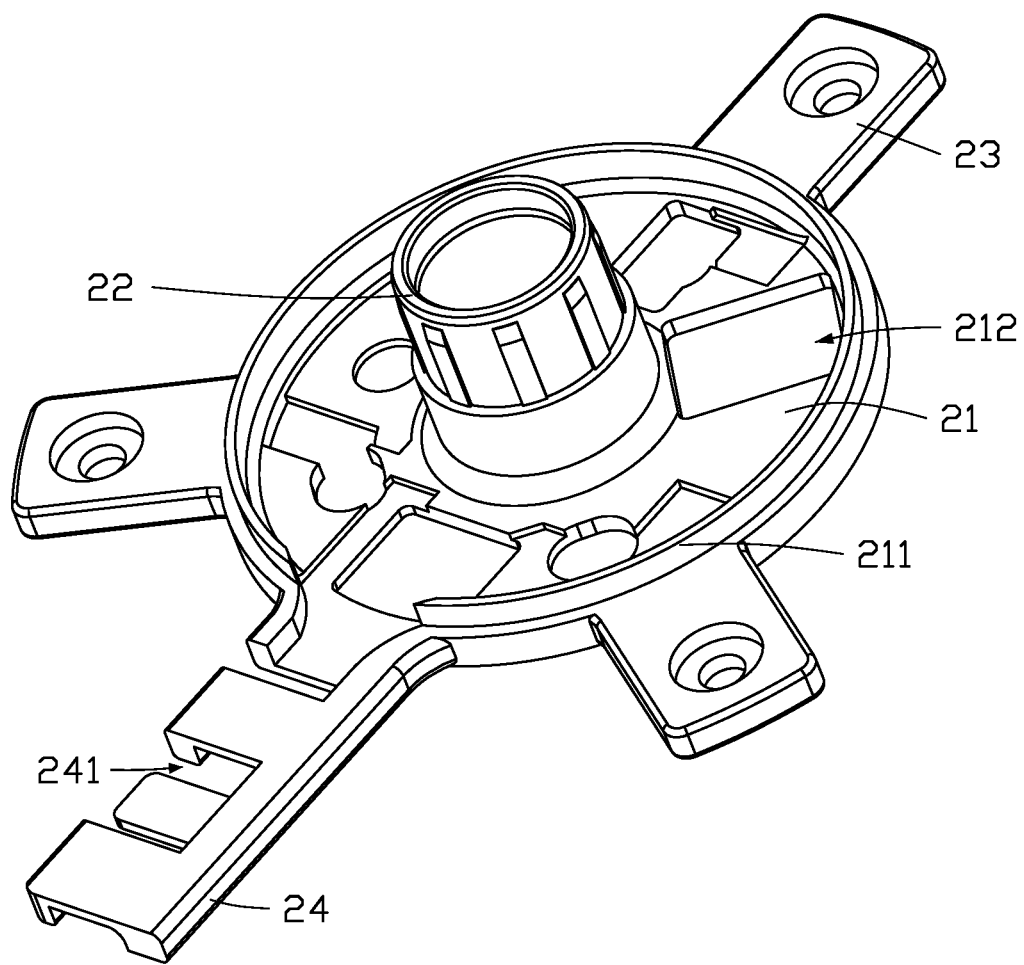
FIG. 3 is a diagrammatic view of a bracket of the fan of FIG. 1.

Referring to FIGS. 2 and 3, in some embodiments, the fan 100 also includes a motor (not shown) and a bracket 20. The motor drives the blades 11 to rotate. The bracket 20 is connected to the hub 10. The hub 10 defines a receiving cavity 101 facing the air outlet 40. The motor is placed in the receiving cavity 101. The bracket 20 includes a base plate 21, a mounting shaft 22 disposed on the base plate 21, and a wiring board 24 extending from a sidewall of the base plate 21. Three mounting plates 23 also extend from the sidewall of the base plate 21, and are spaced apart from each other. The fan 100 can be installed on the heat sink 201 or other devices through the mounting plates 23. An annular flange 211 protrudes from a surface of the base plate 21 facing the hub 10. The annular flange 211 is engaged with the hub 10, so that the bracket 20 and the hub 10 are fixed together. In some embodiments, the annular flange 211 is disposed in the receiving cavity 101 of the hub 10, and is closely attached to an inner wall of the receiving cavity 101. The mounting shaft 22 is disposed on the surface of the base plate 21 facing the hub 10. The motor is rotatably sleeved on the mounting shaft 22. A plurality of ventilation holes 212 penetrate through the base plate 21, which facilitate heat dissipation of the motor. A plurality of openings 241 are defined on the wiring board 24, and wires (not shown) of the motor can be fixed in the openings 241.

Figure 4:
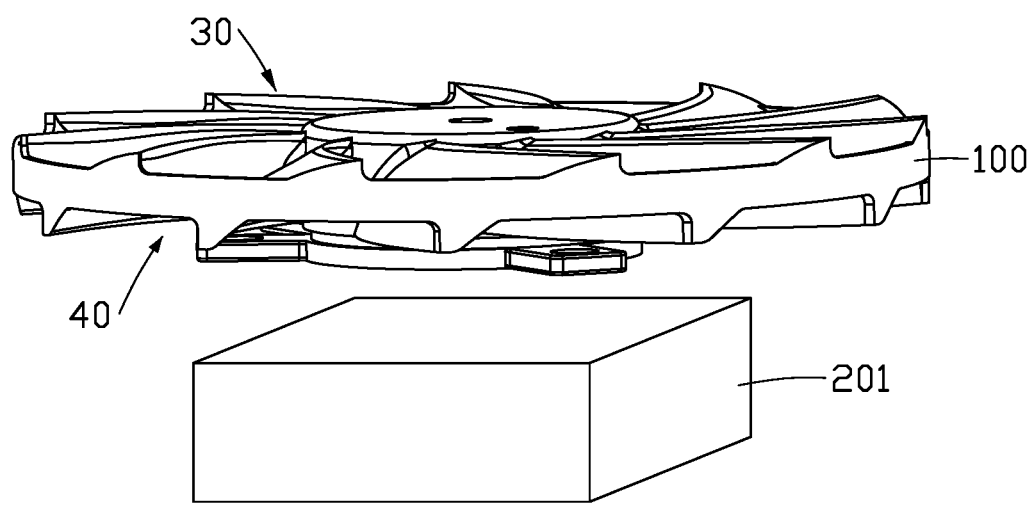
FIG. 4 is a diagrammatic view of an electronic device according to an embodiment of the present disclosure.

Referring to FIG. 4, an electronic device 200 is also provided according to an embodiment of the present disclosure. The electronic device 200 includes the fan 100 and the heat sink 201 disposed below the fan 100. The air outlet 40 of the fan 100 faces the heat sink 201.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A fan, comprising:
    a hub;
    an outer frame surrounding the hub, the outer frame comprising a first side facing an air inlet of the fan, a second side facing an air outlet of the fan, and an inner wall between the first side and the second side;
    a plurality of blades connected between the hub and the outer frame, each of the plurality of blades comprising a first end and a second end opposite to the first end, the first end connected to the hub, the second end connected to the outer frame, an extension direction of the second end inclined with respect to a plane defined by the outer frame;
    wherein the second end comprises a first region and a second region, the second region is connected to the inner wall, the first region extends from the second region and is disposed above the first side, a first notch is defined among the first regions of adjacent two of the plurality of blades and the first side;
    wherein the outer frame further comprises a plurality of first protrusions protruding from the first side, the plurality of first protrusions is coplanar and integrally formed with the outer frame, the first region of each of the plurality of blades is connected to a top surface of a corresponding one of the plurality of first protrusions away from the first side, and the first notch is disposed between adjacent two of the plurality of first protrusions.

2. The fan according to claim 1, wherein the second end further comprises a third region extending from the second region and disposed above the second side, and the first region and the third region are located on opposite sides of the second region; a second notch is defined between the third regions of adjacent two of the plurality of blades and the second side.

3. The fan according to claim 2, wherein the outer frame further comprises a plurality of second protrusions protruding from the second side, the plurality of second protrusions is coplanar and integrally formed with the outer frame, the third region of each of the plurality of blades is connected to a top surface of a corresponding one of the plurality of second protrusions away from the second side, and the second notch is defined between adjacent two of the plurality of second protrusions.

4. The fan according to claim 1, wherein each of the plurality of first protrusions is triangular.

5. The fan according to claim 1, wherein a vertical height between the first side and the second side is greater than one third of a length of the second end.

6. The fan according to claim 1, wherein along the extension direction of the second end, the outer frame is connected to a middle area of the second end.

7. The fan according to claim 1, further comprising a bracket connected to the hub.

8. The fan according to claim 7, wherein the bracket comprises a base plate, a mounting shaft disposed on the base plate, and a wiring board extending from a sidewall of the base plate, an annular flange protruded from a surface of the base plate faces the hub, the annular flange is engaged with the hub.

9. The fan according to claim 8, wherein a plurality of ventilation holes penetrates through the base plate.

10. An electronic device, comprising:
    a heat sink; and
    a fan comprising an air inlet and an air outlet, the air outlet facing the heat sink, the fan further comprising:
        a hub;
        an outer frame surrounding the hub, the outer frame comprising a first side facing the air inlet of the fan, a second side facing the air outlet of the fan, and an inner wall between the first side and the second side; and
        a plurality of blades connected between the hub and the outer frame, each of the plurality of blades comprising a first end and a second end opposite to the first end, the first end connected to the hub, the second end connected to the outer frame, an extension direction of the second end inclined with respect to a plane defined by the outer frame;

wherein the second end comprises a first region and a second region, the second region is connected to the inner wall, the first region extends from the second region and is disposed above the first side, a first notch is defined among the first regions of adjacent two of the plurality of blades and the first side, the heat sink is disposed below the fan;

wherein the outer frame further comprises a plurality of first protrusions protruding from the first side, the plurality of first protrusions is coplanar and integrally formed with the outer frame, the first region of each of the plurality of blades is connected to a top surface of a corresponding one of the plurality of first protrusions away from the first side, and the first notch is disposed between adjacent two of the plurality of first protrusions.

11. The electronic device according to claim 10, wherein the second end further comprises a third region extending from the second region and disposed above the second side, and the first region and the third region are located on opposite sides of the second region; a second notch is defined between the third regions of adjacent two of the plurality of blades and the second side.

12. The electronic device according to claim 11, wherein the outer frame further comprises a plurality of second protrusions protruding from the second side, the plurality of second protrusions is coplanar and integrally formed with the outer frame, the third region of each of the plurality of blades is connected to a top surface of a corresponding one of the plurality of second protrusions away from the second side, and the second notch is defined between adjacent two of the plurality of second protrusions.

13. The electronic device according to claim 10, wherein each of the plurality of first protrusions is triangular.

14. The electronic device according to claim 10, wherein a vertical height between the first side and the second side is greater than one third of a length of the second end.

15. The electronic device according to claim 10, wherein along the extension direction of the second end, the outer frame is connected to a middle area of the second end.

16. The electronic device according to claim 10, wherein the fan further comprises a bracket connected to the hub.

17. The electronic device according to claim 16, wherein the bracket comprises a base plate, a mounting shaft disposed on the base plate, and a wiring board extending from a sidewall of the base plate, an annular flange protruded from a surface of the base plate faces the hub, the annular flange is engaged with the hub.

18. The electronic device according to claim 17, wherein a plurality of ventilation holes penetrates through the base plate.

* * * * *